United States Patent
Zeng

(10) Patent No.: US 7,070,088 B2
(45) Date of Patent: Jul. 4, 2006

(54) METHOD OF SEMICONDUCTOR DEVICE ASSEMBLY INCLUDING FATIGUE-RESISTANT TERNARY SOLDER ALLOY

(75) Inventor: Kejun Zeng, Coppell, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/797,779

(22) Filed: Mar. 9, 2004

(65) Prior Publication Data

US 2005/0199684 A1    Sep. 15, 2005

(51) Int. Cl.
*B23K 31/00* (2006.01)
*B23K 35/12* (2006.01)

(52) U.S. Cl. ............. 228/246; 228/248.1; 228/180.22; 174/263

(58) Field of Classification Search ............. 228/248.1, 228/180.22, 227, 246; 148/22–24; 257/737, 257/738, 777–779; 428/643
See application file for complete search history.

(56) References Cited

U.S. PATENT DOCUMENTS

| | | | | |
|---|---|---|---|---|
| 3,855,679 A | * | 12/1974 | Schmatz | 428/643 |
| 5,803,344 A | * | 9/1998 | Stankavich et al. | 228/180.22 |
| 6,050,480 A | * | 4/2000 | Taguchi et al. | 228/248.1 |
| 6,142,363 A | * | 11/2000 | Tanahashi et al. | 228/224 |
| 6,214,636 B1 | * | 4/2001 | Sawayama et al. | 438/57 |
| 6,300,578 B1 | * | 10/2001 | Hoffmeyer et al. | 174/263 |
| 6,576,971 B1 | * | 6/2003 | Kimoto et al. | 257/467 |
| 6,902,102 B1 | * | 6/2005 | Tanabe et al. | 228/260 |
| 2001/0028109 A1 | * | 10/2001 | Shimizu et al. | 257/737 |

FOREIGN PATENT DOCUMENTS

| | | | | |
|---|---|---|---|---|
| JP | 2001-113387 A | * | 4/2001 | |
| JP | 2002-086294 A | * | 3/2002 | |

\* cited by examiner

*Primary Examiner*—Lynne R. Edmondson
(74) *Attorney, Agent, or Firm*—W. James Brady, III; Frederick J. Telecky, Jr.

(57) ABSTRACT

Method for assembling a semiconductor device having fatigue-resistant interconnection fillet provides a semiconductor chip with at least one solder bump comprising an alloy of tin and lead with a melting temperature higher than the solder paste used. Further, a solder paste (preferably binary) is provided, which comprises tin and about 2.5 weight percent silver, and has a melting temperature of about 221° C. The solder bump is brought in contact with the solder paste, the bump is partially immersed in the paste, and thermal energy is supplied to reflow the solder paste at about 235° C. The amount of energy and time after the reflow of the paste is controlled so that the molten paste dissolves a pre-determined amount of the solder bump (lead and tin) to form a ternary alloy of about eutectic composition (about 1.62 weight % Ag, 36.95 weight % Pb, 61.43 weight % Sn) without melting the solder bump.

8 Claims, 6 Drawing Sheets

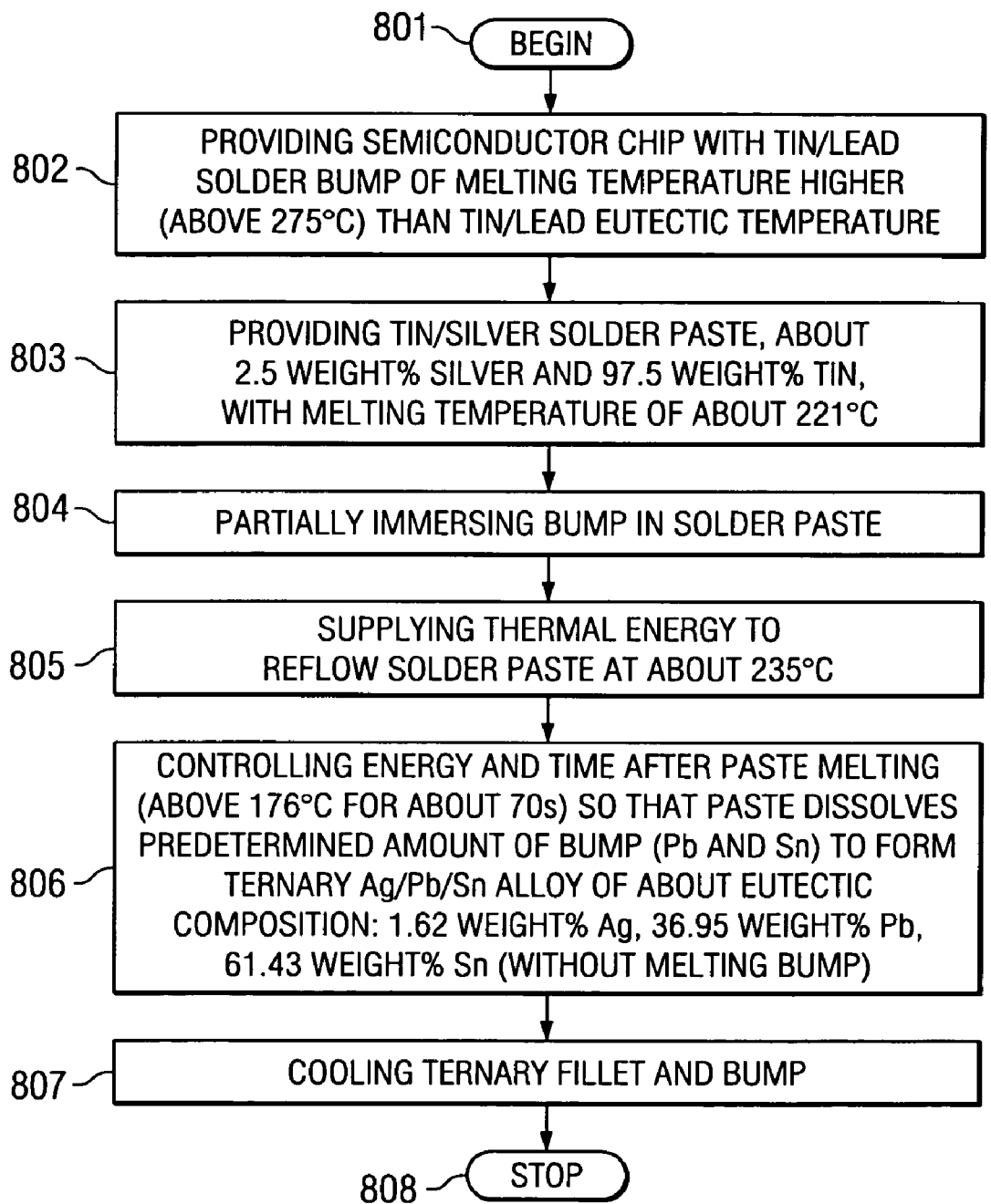

METHOD OF SEMICONDUCTOR DEVICE ASSEMBLY INCLUDING FATIGUE-RESISTANT TERNARY SOLDER ALLOY

FIELD OF THE INVENTION

The present invention is related in general to the field of metallurgical systems with application to electronic systems and semiconductor devices, and more specifically to structures and methods that include fatigue-resistant ternary solder alloys.

DESCRIPTION OF THE RELATED ART

During and after assembly of an integrated circuit (IC) chip to an external part such as a substrate, ceramic or circuit board by solder reflow, and then during device operation, significant temperature differences and temperature cycles occur between the semiconductor chip and the substrate. This is especially true of flip-chip type mounting schemes. The reliability of the solder joint is strongly influenced by the coefficients of thermal expansion of the semiconductor material and the substrate material. For example, there is more than one order of magnitude difference between the coefficients of thermal expansion of silicon and FR-4. This difference causes thermomechanical stresses, most of which are absorbed by the solder joints.

Thermomechanical stress difficulties are aggravated by coplanarity problems of the solder balls and the difficulties involved in obtaining a favorable height-to-diameter ratio and uniformity of the solder interconnection. These difficulties start with the solder ball attach process. As an example, when solder paste is dispensed, the volume of solder paste may vary in volume, making it difficult to control the solder ball height. Control difficulties are aggravated when the whole solder ball is melting during the reflow process and has to solidify uniformly at the end of the reflow process.

Furthermore, evidence suggests that solder connections of short length and non-uniform width are unfavorable for stress distribution and strain absorption. The stress remains concentrated in the region of the chip-side solder joint, where it may lead to early material fatigue and crack phenomena. This fact causes a particular reliability risk when the fillet of the solder joint has a poorly controlled composition at the end of the reflow process and includes stress-sensitive metallurgical phases.

The fabrication methods and reliability problems involving flip-chips re-appear, in somewhat modified form, for ball-grid array type packages, including chip-scale packages (CSP). Most CSP approaches are based on flip-chip assembly with solder bumps or solder balls on the exterior of the package, to interface with system or wiring boards.

Following the solder reflow step, flip-assembled chips and packages often use a polymeric underfill between the chip, or package, and the interposer, substrate, or printed circuit board (PCB). These underfill materials alleviate some of the thermomechanical stress caused by the mismatch of the coefficients of thermal expansion (CTE) of package components. But as a process step, underfilling is time-consuming and expensive, and is preferably avoided.

During the last decade, a number of variations in device structure, materials, or process steps have been implemented in manufacturing in order to alleviate the thermomechanical stress problem. All of them suffer from some drawback in cost, fabrication flow, material selection, and so forth.

A need has therefore arisen for a coherent, low-cost method of assembling flip-chip integrated circuit chips and semiconductor devices that provides a high degree of thermomechanical stress reliability. The method should be flexible enough to be applied for different semiconductor product families and a wide spectrum of design and process variations. Preferably, these innovations should be accomplished using the installed equipment base so that no investment in new manufacturing machines is needed.

SUMMARY OF THE INVENTION

One embodiment of the invention is a method for the assembly of a semiconductor device having fatigue-resistant interconnection elements. In this method, a semiconductor chip has at least one solder bump comprising an alloy of tin and lead with a melting temperature higher than the solder paste used. Further, a binary solder paste is provided, which comprises tin and silver, and has a melting temperature of about 221° C. In the next process step, the solder bump is brought in contact with the solder paste and the bump is partially immersed in the paste. Thermal energy is supplied to melt the solder paste at about 235° C. The amount of energy and time after the melting of the solder paste is controlled so that the molten paste dissolves a pre-determined amount of the solder bump to composition without melting the solder bump.

It is a technical advantage of the invention that the ternary alloy of the solder fillet is fatigue-resistant and thus well suited to absorb thermo-mechanical stress.

In a preferred embodiment, the bump alloy comprises about 10 weight percent tin and about 90 weight percent lead and has a melting temperature higher than 275° C.; the binary solder paste has a composition of about 2.5 weight percent silver and about 97.5 weight percent tin. After reflow, the paste fillet will be a ternary alloy comprising between 1.5 and 1.7 weight percent silver, between 36 and 38 weight percent lead, and between 60.3 and 62.5 weight percent tin, and is reached after about 70 seconds at a temperature of about 176° C. The preferred ternary alloy composition is about 1.62 weight percent silver, 36.95 weight percent lead, and 61.43 weight percent tin.

It is a technical advantage of the invention to use a silver-containing solder paste, for example, a binary paste. Without the silver, for instance by using a eutectic tin/lead paste, the thermal fatigue of the joint would be lower. With a ternary solder paste, for instance by using a tin/lead/silver paste, the lead content of the fillet after reflow would be higher than needed, decreasing the thermal fatigue of the fillet.

Another embodiment of the invention is a fatigue-resistant solder alloy comprising a ternary alloy including tin, silver and lead of approximately eutectic melting temperature; the alloy comprises about 1.0 to 1.7 weight percent silver, preferably about 1.62 weight percent silver.

Another embodiment of the invention is an assembled semiconductor device comprising a semiconductor chip including at least one bond pad having an attached metallic interconnection element; this element is made of a material not reflowing during the attachment process. The device further includes a substrate having at least one contact pad. The chip interconnection element is attached to the substrate contact pad using an attachment alloy comprising a ternary alloy of tin, lead, and approximately 1.5 to 1.7 weight percent silver. A preferred content of the ternary alloy is about 1.62 weight percent silver, about 36.95 weight percent lead, and about 61.43 weight percent tin.

It is a technical advantage of the preferred silver content that the formation of Ag$_3$Sn plates at the fillet/pad interface is inhibited, which prevents a degradation of the solder joint reliability.

The technical advances represented by the invention, as well as the aspects thereof, will become apparent from the following description of the preferred embodiments of the invention, when considered in conjunction with the accompanying drawing and the novel features set forth in the appended claims.

BRIEF DESCRIPTION OF THE DRAWINGS

FIG. 1 depicts the lead/tin binary phase diagram.

FIG. 2 depicts the silver/tin binary phase diagram.

FIG. 3 depicts the silver/lead binary phase diagram.

FIG. 8 is a block diagram of the device assembly process flow according to the invention.

DETAILED DESCRIPTION OF THE PREFERRED EMBODIMENTS

Figure 1:
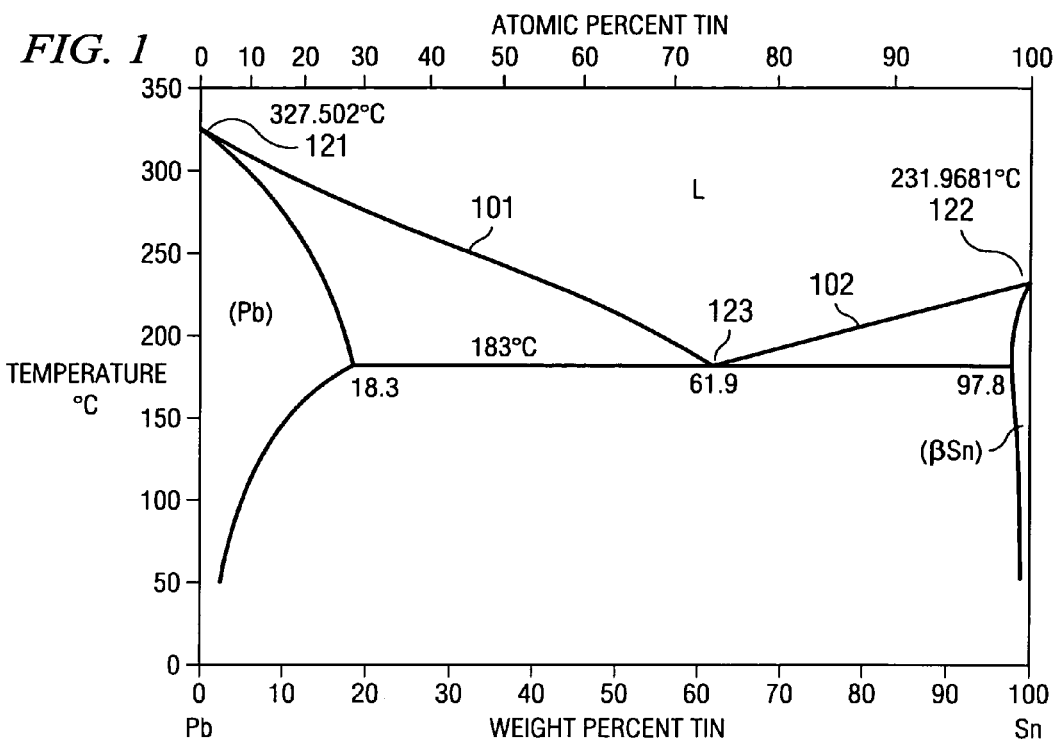
FIGS. 1, 2 and 3 are binary phase diagrams after T. B. Massalski, "Binary Alloy Phase Diagrams", published by ASM International, 1990.

In order to create a fatigue-resistant solder alloy comprising three components—a ternary alloy—, the invention relies in part on three binary phase diagrams of the elements involved in the ternary alloy. FIG. 1 illustrates the phase diagram of the binary lead/tin (Pb/Sn) alloy system. Data and graphs of binary alloys have been published and may be found, for instance, in T. B. Massalski, "Binary Alloy Phase Diagrams", published by ASM International, 1990. In FIG. 1, weight percent tin (Sn) is plotted on the abscissa, from 0% Sn (corresponding to 100% lead, Pb) to 100% Sn (corresponding to 0% Pb), and the temperature is plotted on the ordinate, in ° C., from 0° C. to temperatures beyond the melting points of the individual metals. The liquid regime "L" is marked by the portions 101 and 102 of the liquidus curve. The melting point 121 of lead is indicated as 327.502° C., and the melting point 122 of tin as 231.9681° C. The eutectic temperature 123 is reached at 183° C. for 61.9 weight % tin in the alloy.

Figure 2:
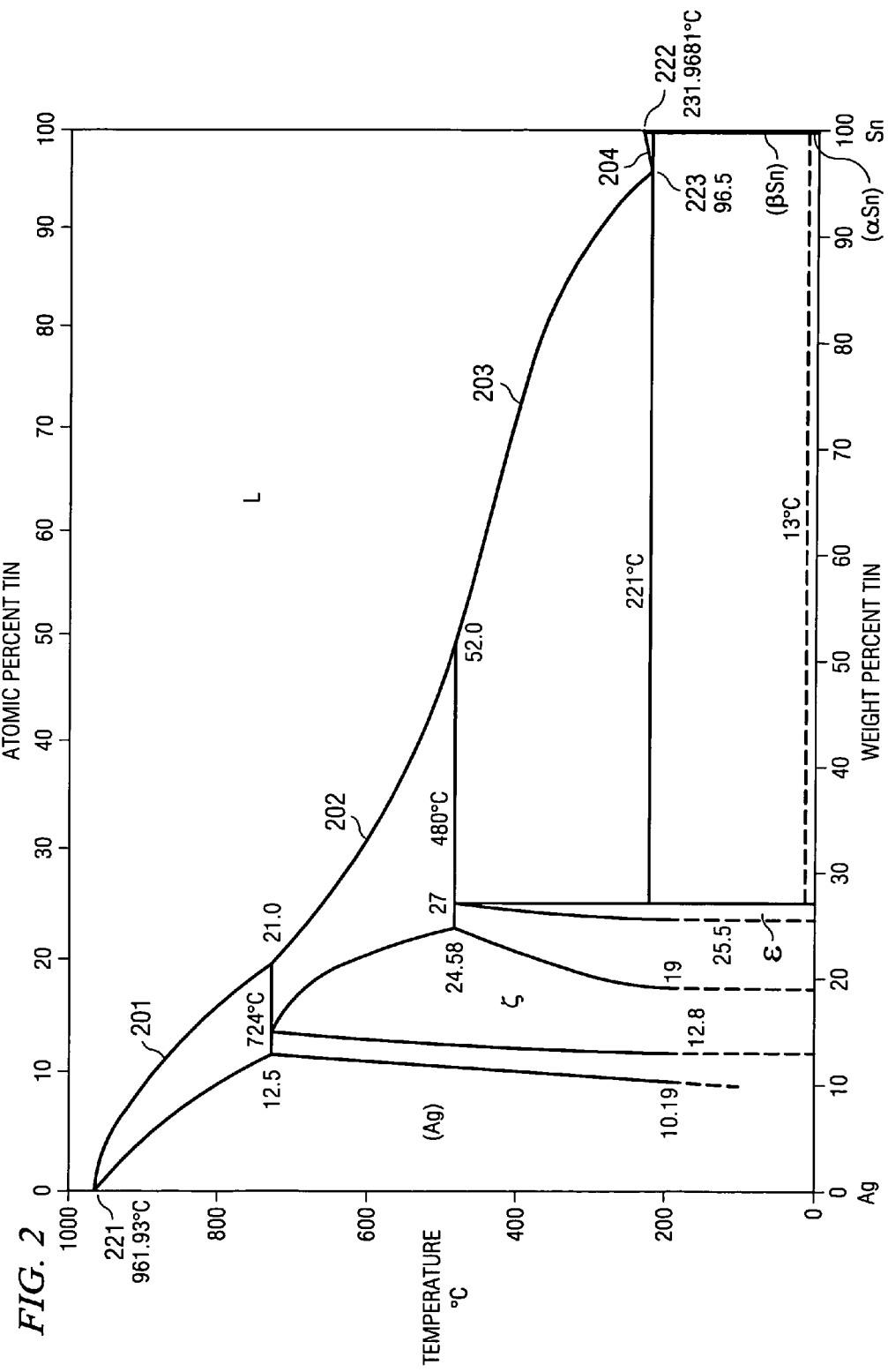

FIG. 2 illustrates the phase diagram of the binary silver/tin (Ag/Sn) alloy system (after T. B. Massalski, "Binary Alloy Phase Diagrams, ASM International, 1990). The abscissa plots weight percent tin from 0% Sn (corresponding to 100% Ag) to 100% Sn (corresponding to 0% Ag), and the ordinate plots the temperature from 0° C. to 1000° C. The melting point 221 of silver is indicated as 961.93° C. and the melting point 222 of tin as 231.9681° C. The eutectic temperature 223 is reached at 221° C. at 96.5 weight % tin in the alloy. The liquidus curve has four portions 201, 202, 203 and 204.

Figure 3:
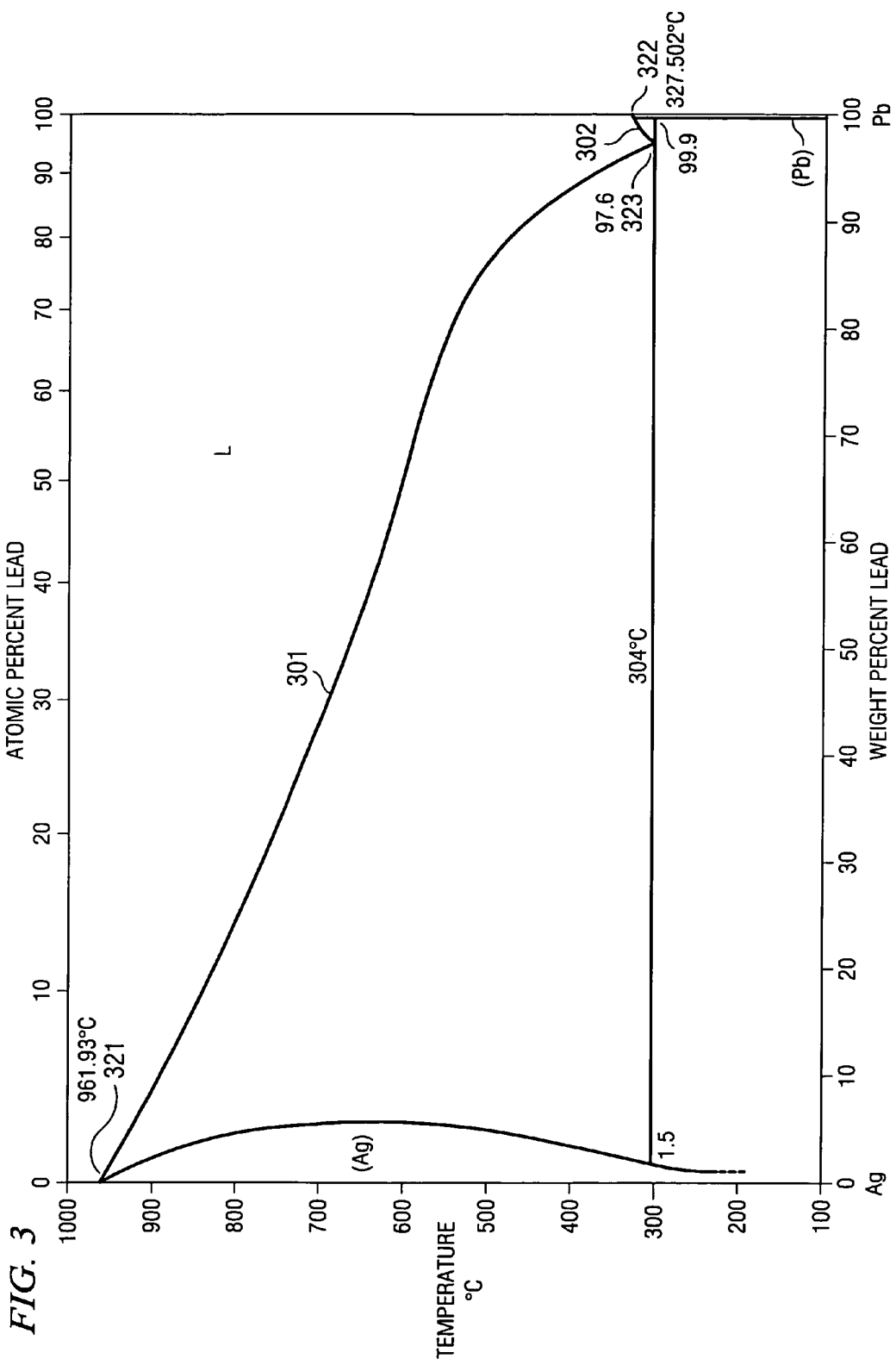

FIG. 3 illustrates the phase diagram of the binary silver/lead (Ag/Pb) alloy system (after T. B. Massalski, "Binary Alloy Phase Diagrams, ASM International, 1990). The abscissa plots weight percent lead from 0% Pb (corresponding to 100% Ag), to 100% Pb (corresponding to 0% Ag), and the ordinate plots the temperature from 0° C. to 1000° C. The melting point 321 of silver is indicated as 961.93° C. and the melting point 322 of lead as 327.502° C. The eutectic temperature 323 is reached at 304° C. at 97.6 weight % lead in the alloy. The liquidus curve has two portions 301 and 202.

Using the three binary phase diagrams of FIGS. 1, 2, and 3, the invention can be understood by arranging the binary phase diagrams in a 3-dimensional system as discussed, for instance, by Mats Hillert in "Phase Equilibria, Phase Diagrams and Phase Transformations: Their Thermodynamic Basis", Cambridge University Press, U.K., 1998. The result is shown in the schematic perspective view of FIG. 4. In the three planes forming the 3-dimensional system, the ordinates plot the temperature (in ° C.) from 0° C. to 1000° C. As FIG. 4 shows, the system resembles a prism with a triangular base having sides 401, 402 and 403 and rectangular sides (looking like parallelograms in the perspective view of FIG. 4) having identical ordinates 411, 412 and 413.

Figure 4:
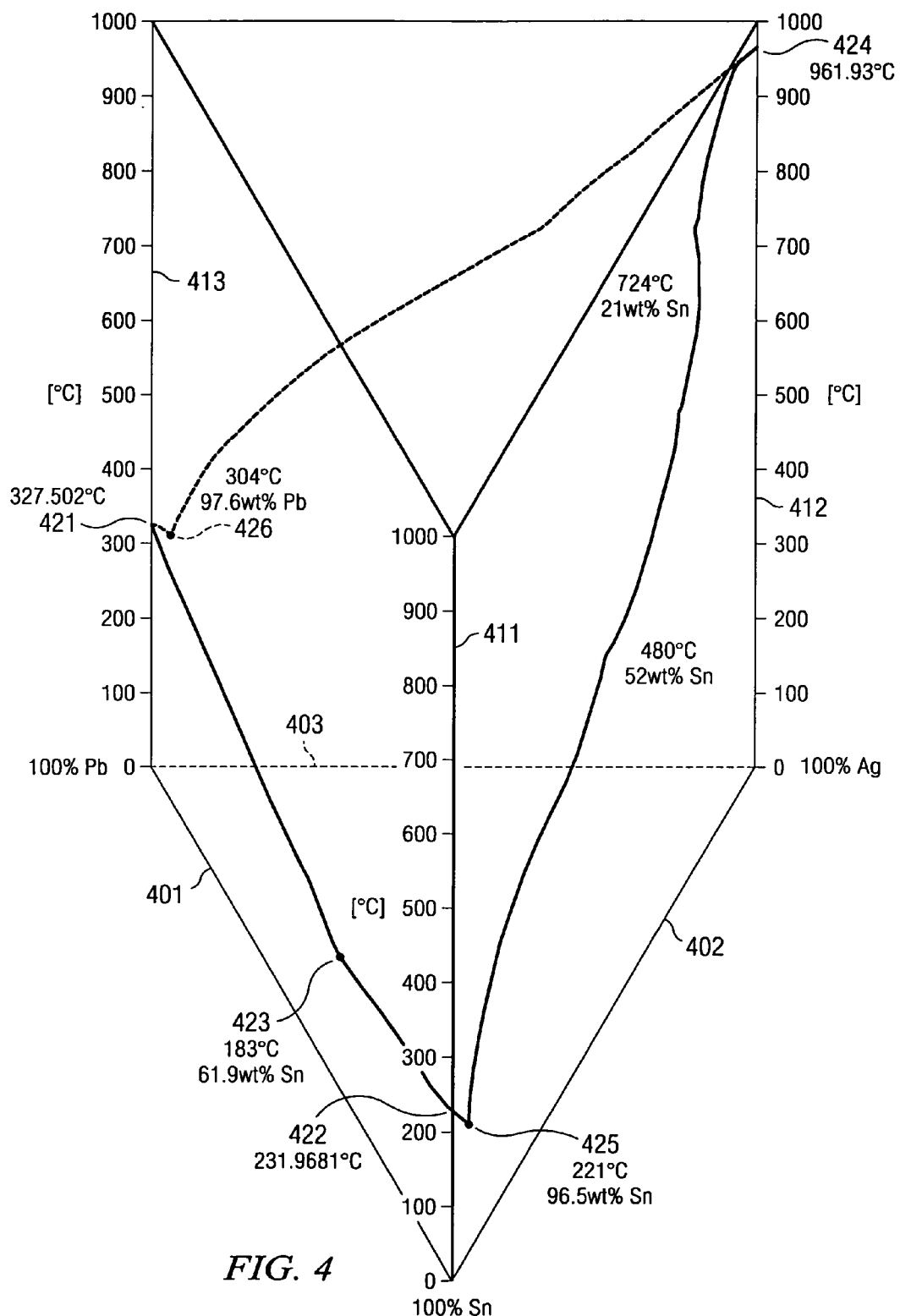
FIG. 4 illustrates schematically a perspective view of the methodology used by the invention to combine the three binary phase diagrams of FIGS. 1, 2, and 3 into a three-dimensional system and project the three liquidus surfaces onto one plane.

The liquidus curve of the lead/tin binary system of FIG. 1 is reproduced in FIG. 4 in the left side parallelogram formed by abscissa 401 and ordinate 413. The melting point 421 of lead at 327.502° C. is, of course, the same as point 121 in FIG. 1 and point 322 in FIG. 3; the melting point 422 of tin at 231.9681is, of course, the same as point 122 in FIG. 1 and point 222 in FIG. 2. The eutectic point 423 of the lead/tin binary system is plotted at 183° C., same as at point 123 in FIG. 1.

Analogous considerations hold for the liquidus curve of the silver/tin binary system of FIG. 2, reproduced in FIG. 4 on the right side parallelogram formed by abscissa 402 and ordinate 411. The melting point 422 of tin appears at 231.9681° C., and the melting point 424 of silver at 961.93° C. The eutectic point 425 of the silver/tin binary system is plotted at 221° C., same as point 223 in FIG. 2.

Finally, analogous considerations hold for the liquidus curve of the silver/lead binary system of FIG. 3, reproduced in FIG. 4 on the back side parallelogram formed by abscissa 403 and ordinate 412. The melting point 424 of silver appears at 961.93° C., and the melting point 421 of lead at 327.502° C. The eutectic point 426 of the silver/lead binary system is plotted at 304° C., same as point 323 in FIG. 3.

Figure 5:
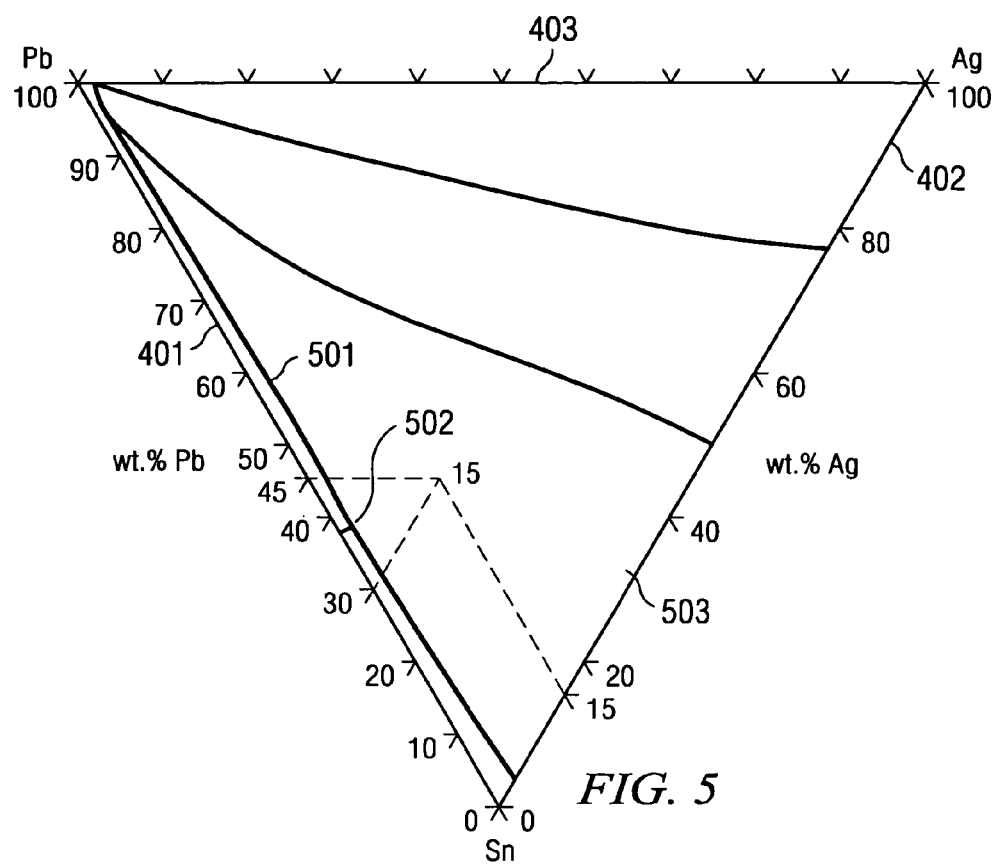
FIG. 5 is the projection of the liquidus surfaces according to the invention, providing the ternary eutectic point and temperature.

In order to arrive at the ternary phase diagram of the tin/lead/silver system, the invention projects the liquidus curves of FIG. 4 onto the triangular base formed by sides 401, 402, and 403 (method described, for instance, in the book by Mats Hillert, quoted above). The result is shown in FIG. 5. Side 401 plots the weight percent of lead in the ternary system, and side 402 the weight percent of silver. The resultant liquidus curve of the ternary tin/lead/liver system is indicated by the heavy black line 501 in FIG. 5. The eutectic point 502 of the ternary system is reached at a composition of 1.62 weight percent silver and 36.95 weight percent lead, with 61.43 weight percent tin. Satisfactory results in terms of fatigue-resistant ternary alloys are obtained in the regime between 1.5 and 1.7 weight percent silver, between 36 and 38 weight percent lead, and between 60.3 and 62.5 weight percent tin.

Figure 6:
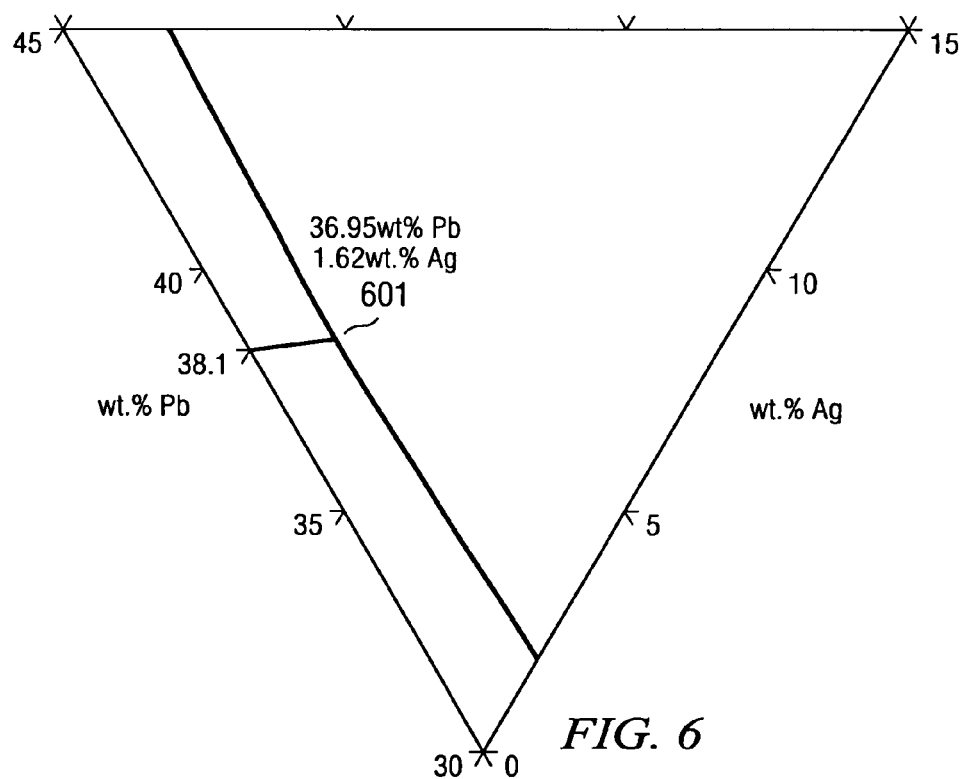
FIG. 6 shows an enlarged portion of FIG. 5 around the ternary eutectic point.

The phase diagram region between 45 and 30 weight percent lead of side 401 is magnified in FIG. 6, together with the phase diagram region between 0 and 15 weight percent silver of said 402. The eutectic point 601 of the ternary tin/lead/silver system is reached at 1.62 weight % silver, 36.95 weight % lead, and 61.43 weight % tin.

As mentioned above, while the composition of 1.62 weight % silver represent the preferred composition, a slightly wider range of 1.5 to 1.7 weight percent silver still delivers acceptable results in practical applications. The range for lead is between 36 and 38 weight percent, which leaves a range between 60.3 to 62.5 weight percent tin.

Figure 7:
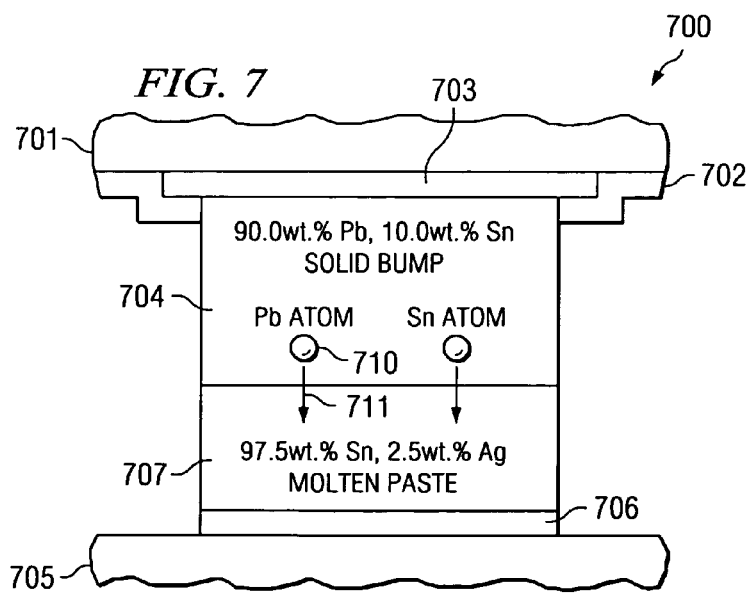
FIG. 7 is a schematic cross section of a portion of a semiconductor device having a solid interconnection element, assembled according to the invention using a molten paste.

Another embodiment of the present invention is an assembled semiconductor device, partially and schematically depicted in FIG. 7. The device, generally designated 700, comprises a semiconductor chip 701, protected by an overcoat 702; the chip includes at least one bond pad 703. Bond pad 703 has an attached metallic interconnection element, preferably a solid bump or ball. This element is made of a material, which does not reflow during the attachment process of the device to a substrate (705). A typical element consists of an alloy of 90 weight percent lead and 10 weight percent tin. The assembled device 700 further comprises a substrate 705 (made, for example, of ceramic, plastic or composite material such FR-4), which has at least one contact pad 706.

The attachment of the chip interconnection element 704 to substrate contact pad 706 is provided by a molten solder paste 707, which consists preferably of a binary paste of 97.5 weight percent tin and 2.5 weight percent silver. Alternatively, a ternary paste with less than 20 weight percent lead and less than 3 percent silver may be used (balance tin). During the attachment process, the molten paste dissolves lead (and tin) from the solid bump 704, symbolized in FIG. 7 by a lead atom 710 with dissolution vector 711 into the molten paste 707. By carefully controlling the reflow process, the composition of the molten solder paste can be engineered to be close to the eutectic point of the Sn/Ag/Pb system. When the attachment is completed and the fillet solidified, the fillet comprises a ternary alloy of tin, lead and approximately 1.5 to 1.7 weight percent silver. The preferred silver content is 1.62 weight percent, and the preferred lead content 36.95 weight percent, with the balance of 61.43 weight percent tin. A eutectic or near eutectic microstructure of $Sn+Pb+Ag_3Sn$ will give the solder fillet high resistance to thermal fatigue.

The reason for limiting the silver content of the tin/silver paste to the upper limit of 2.5 weight % silver is to prevent the composition of the molten solder paste from falling into the primary $Ag_3Sn$ field (503 in FIG. 5) of the phase diagram. If eutectic tin/silver solder paste having 3.5 weight percent silver were used, the continued dissolution of lead from the bump 704 in the attachment process would allow the level of 36.95 weight % Pb to be reached at a time, when the silver content of the paste would be more than 2 weight percent. With this much silver, primary $Ag_3Sn$ plates would form at the attachment interface, resulting in great degradation of the solder joint reliability. Another embodiment of the invention is a method for the assembly of a semiconductor device having fatigue-resistant interconnection elements. The process flow is outlined in the block diagram of FIG. 8. The method, beginning at 801, comprises first the step 802 of providing a semiconductor chip having at least one solder bump comprising an alloy of tin and lead; the bump alloy has a melting temperature higher than the tin/lead eutectic temperature. A preferred bump alloy composition is 10 weight percent tin and 90 weight percent lead, and the melting temperature is preferably higher than 275° C. Next is the step 803 of providing a binary solder paste comprising tin and silver. The preferred paste composition is about 2.5 weight percent silver and about 97.5 weight percent tin. The solder paste has a melting temperature of about 221° C. Another possibility is a solder paste with a composition of 2 to 3 weight percent silver and 97 to 98 weight percent tin (in either case the formation of $Ag_3Sn$ plates in the final fillet is avoided). Alternatively, a ternary paste with up to 20 weight percent lead and 3 weight percent silver (balance tin) may be used.

In step 804, the solder bump is brought in contact with the solder paste and the bump is partially immersed in the paste. In step 805, thermal energy is then supplied to reflow the solder paste at about 235° C.

The amount of energy and the time after melting the solder paste are controlled in Step 806 so that the molten paste dissolves a pre-determined amount of the solder bump in order to form a ternary alloy of about eutectic composition without melting the solder bump. It is preferred that a temperature above 176° C. is maintained for about 70 seconds. Preferably, the final fillet is a ternary alloy comprising about 1.62 weight percent silver, about 36.95 weight percent lead, and about 61.43 weight percent tin.

In Step 807, the thermal energy is removed to cool the ternary alloy fillet and the bump, which completes the process flow at Step 808.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description.

It is therefore intended that the appended claims encompass any such modifications and embodiments.

I claim:

1. A method for the assembly of a semiconductor device having fatigue-resistant interconnection elements, comprising the steps of:

providing a semiconductor chip having at least one solder bump comprising an alloy of about ten weight percent tin and about ninety weight percent lead;

providing a solder paste comprising tin and silver, said solder paste having a reflow temperature of about 221° C., said bump alloy having a melting temperature higher than said paste reflow temperature;

bringing said solder bump in contact with said solder paste and immersing said bump partially in said paste;

supplying thermal energy to reflow said solder paste at about 235° C.;

controlling the amount of energy and time after said melting of said solder paste so that the molten paste dissolves a pre-determined amount of said solder bump to form a tin/lead/silver ternary alloy of about eutectic composition without melting said solder bump; and removing said thermal energy to cool said ternary alloy fillet and said bump.

2. The method according to claim 1 wherein said solder paste is a binary solder paste having a composition of 2 to 3 weight percent silver and 97 to 98 weight percent tin so that the formation of primary $Ag_3Sn$ plates in said fillet is avoided.

3. The method according to claim 2 wherein said binary solder alloy paste has a composition of about 2.5 weight percent silver and about 97.5 weight percent tin.

4. The method according to claim 1 wherein said solder paste is a ternary solder paste having up to 20 weight percent lead, up to 3 weight percent silver, and the balance tin.

5. The method according to claim 1 wherein said bump alloy has a melting temperature higher than 275° C.

6. The method according to claim 1 wherein said bump alloy comprises about 10 weight percent tin and about 90 weight percent lead.

7. The method according to claim 1 wherein said controlling of energy and time comprises a temperature above 176° C. for about 70 seconds.

8. The method according to claim 1 wherein said ternary alloy comprises about 1.62 weight percent silver, about 36.95 weight percent lead, and about 61.43 weight percent tin.

* * * * *